(12) United States Patent
Birnbaum et al.

(10) Patent No.: US 8,012,403 B2
(45) Date of Patent: Sep. 6, 2011

(54) METHOD FOR PRODUCING HIGH PURITY LOW DIELECTRIC CONSTANT CERAMIC AND HYBRID CERAMIC FILMS

(75) Inventors: Jerome C. Birnbaum, Richland, WA (US); Glen E. Fryxell, Kennewick, WA (US); Shari Li Xiaohong, Richland, WA (US); Christopher A. Coyle, Pasco, WA (US); Glen C. Dunham, Kennewick, WA (US); Suresh Baskaran, Kennewick, WA (US); Ralph E. Williford, Kennewick, WA (US)

(73) Assignee: Battelle Memorial Institute, Richland, WA (US)

( * ) Notice: Subject to any disclaimer, the term of this patent is extended or adjusted under 35 U.S.C. 154(b) by 1691 days.

(21) Appl. No.: 10/489,924

(22) PCT Filed: Sep. 14, 2001

(86) PCT No.: PCT/US01/28704
§ 371 (c)(1),
(2), (4) Date: Mar. 12, 2004

(87) PCT Pub. No.: WO03/024894
PCT Pub. Date: Mar. 27, 2003

(65) Prior Publication Data
US 2005/0258578 A1    Nov. 24, 2005

(51) Int. Cl.
*B28B 1/30* (2006.01)
(52) U.S. Cl. ........... 264/656; 264/44; 264/628; 264/675
(58) Field of Classification Search ............ 264/44, 264/628, 656, 675
See application file for complete search history.

(56) References Cited

U.S. PATENT DOCUMENTS

| | | | |
|---|---|---|---|
| 3,600,330 A * | 8/1971 | Schneble, Jr. et al. | 106/1.11 |
| 4,520,114 A | 5/1985 | David | 501/12 |
| 4,631,158 A * | 12/1986 | Rieck et al. | 264/43 |
| 4,661,315 A * | 4/1987 | Wiech, Jr. | 419/10 |
| 5,063,003 A | 11/1991 | Gonzalez-Oliver | 264/14 |
| 5,076,980 A | 12/1991 | Nogues et al. | 264/65 |
| 5,922,299 A | 7/1999 | Bruinsma | 423/335 |
| 6,090,448 A | 7/2000 | Wallace et al. | 427/337 |
| 7,067,470 B2 * | 6/2006 | Cauwberghs et al. | 510/475 |
| 2002/0034626 A1 * | 3/2002 | Liu et al. | 428/312.6 |

* cited by examiner

Primary Examiner — Matthew J Daniels
Assistant Examiner — Russell J Kemmerle, III
(74) Attorney, Agent, or Firm — Marger Johnson & McCollom, P.C.

(57) ABSTRACT

Porous ceramic and hybrid ceramic films are useful as low dielectric constant interlayers in semiconductor interconnects. (Hybrid ceramic films are defined as films that contain organic and ceramic molecular components in the structure, as, for example, organosilicates). This invention describes the usefulness of humidity treatments (using specific temperature/humidity treatments as illustrative examples) in increasing mechanical integrity of porous dielectric films with minimal detrimental effect on film porosity or dielectric constant and with no adverse impact on film quality. The efficacy of such treatments is illustrated using surfactant-templated mesoporous silicate films as an example. This invention also describes a specific family of additives to be used with highly pure alkali-metal-free ceramic and hybrid precursors for such dielectric films that will enable better control of the film porosity and quality and lower dielectric constants with the required mechanical integrity. The efficacy of such additives is illustrated using surfactant-templated mesoporous silicate films as a model example. The invention should be broadly applicable to any cross-linked ceramic or hybrid ceramic films (including silicate and organosilicate films, and especially highly porous forms of the films for low-dielectric constant applications). The invention has been found to be particularly effective with surfactant-templated silicate films with nanometer-scale porosity. The invention in either embodiment should also be applicable to evaporation-induced formation of other cross-linked shapes such as fibers and powders.

16 Claims, No Drawings

METHOD FOR PRODUCING HIGH PURITY LOW DIELECTRIC CONSTANT CERAMIC AND HYBRID CERAMIC FILMS

FIELD OF THE INVENTION

The invention involves methods for producing high-purity, low-dielectric constant (k) silica, organosilicate or other porous ceramic or hybrid-ceramic materials.

BACKGROUND OF THE INVENTION

Porous ceramic films may be formed in a variety of ways to produce semiconductor-quality substrate coatings. In the surfactant-templated method, for example, formation of porous ceramic films, a silica precursor solution used for evaporative-coating of a thin mesoporous silica film on to a silicon wafer is typically composed of a silica/silicate precursor, e.g. TEOS (tetraethyl orthosilicate), a surfactant and water dissolved in a polar organic solvent such as an alcohol, glycerol, or other suitable polar solvent. (See U.S. Pat. No. 5,922,299). The solution is aged for a set time and at a set temperature to allow for the formation of a specific range of sizes of oligomeric hydroxylated silica units. The hydrolysis reaction is catalyzed by the addition of a small amount of acid or base, and to generate the ultimate porosity, a surfactant (non-ionic or ionic) is used as a pore former in the deposition solution mixture. After evaporation-coating onto a silicon wafer, the wafer essentially has a "green" film (oligomeric highly hydroxylated silica units mostly in solid phase with trace amounts of the volatile components).

The green film is dried to remove any remaining solvent and catalyst and to facilitate some consolidation of the structure. Then the film is calcined (heated) to complete or carry out further cross-linking between oligomeric silica units. The drying steps typically are carried out at lower temperatures (approximately 100-200° C.) while the calcinations is carried out at more elevated temperatures (approximately 250-450° C.). Following calcinations, the porous ceramic film is chemically treated to dehydroxylate and hydrophobize the film producing a low dielectric film with high mechanical integrity. There can be variations to this approach of making nanoporous silicate films, including but not limited to variations in the solvent system, silica precursor, or type of pore former, but the procedure described above can be considered as a good example.

SUMMARY OF THE INVENTION

The invention involves a method of forming a porous ceramic or organoceramic material. In accordance with one embodiment, the method includes a) combining a ceramic precursor solution and a pore former into a mixture; b) forming a material from the mixture by evaporation; c) substantially removing the pore former by heating the material; and d) treating the porous material by exposure to a humid environment. In accordance with another embodiment, the method includes a) combining a ceramic precursor solution and a pore former into a mixture, wherein the mixture includes nitrogen-based cations; b) forming a material from the mixture by evaporation; and c) substantially removing the pore former by heating the material.

DETAILED DESCRIPTION OF THE PREFERRED EMBODIMENTS

First Embodiment

In accordance with a first embodiment of the invention, surfactant-templated films were prepared as per procedures described in U.S. Pat. No. 5,922,299 and Patent Cooperation Treaty (PCT) international publication number WO024724, the disclosure of which are incorporated herein by this reference. The solutions were highly pure, with less than approximately 50 parts per billion of alkali and alkaline earth metals. A polyoxyethylene ether surfactant was used as a pore former. Calcination and pore former removal was accomplished employing specific temperature and environmental conditions reported in Table I below. This was followed by further heat treatments under varying humidity environments. Table I shows the change in porosity (refractive index n), film thickness, elastic modulus (in gigaPascals (GPa)), and dielectric constant, k, of similarly treated sets of films exposed to varying amounts of water vapor at ambient temperature following calcinations. The data in

TABLE I

| Film (n = 1.14 – 1.15) | Heat Treatment | Thickness before H2O exposure (Microns) E | $H_2O$ ppm | Time of $H_2O$ exposure (Hours) | n after $H_2O$ exposure | Thickness after $H_2O$ exposure (Microns) E/P | Elastic Modulus (GPa) | Dielectric Constant k at 200° C. |
|---|---|---|---|---|---|---|---|---|
| 1A | 5 min 425° C. $N_2$/5 min 375° C. air | 1.15 | 0 | 0 | 1.15 | 1.15/1.08 | 2.0 | 2.03 |
| 2A | | 1.18 | 2600 | 19 | 1.17 | 1.08/1.01 | 3.1 | 2.16 |
| 3A | | 1.24 | 3800 | 48 | 1.21 | 0.96/0.96 | 4.9 | 2.10 |
| 4A | | 1.24 | 3800 ppm for 48 hrs, then 8300 ppm for 3 hrs | | 1.23 | 0.87/0.86 | 6.1 | 2.15 |
| 1B | 6 min 375° C. air | 1.15 | 0 | 0 | 1.15 | 1.15/1.15 | 2.9 | 2.01 |
| 2B | | 1.17 | 7200 | 20 | 1.18 | 1.05/104 | 4.0 | 2.12 |
| 1C | 10 min 375° C. air | 1.29 | 0 | 0 | 1.15 | 1.29/1.28 | 2.0 | 1.98 |
| 2C | | 1.25 | 10000 | 3 | 1.17 | 1.18/1.16 | 3.0 | 2.10 |
| 3C | | 1.25 | 9300 | 18 | 1.18 | 1.13/1.13 | 3.5 | 2.01 |
| 1D | 1 min 180° C. air 10 min 375° C. air | 1.26 | 0 | 0 | 1.15 | 1.26/1.23 | 2.6 | 1.97 |
| 2D | | 1.26 | 10000 | 3 | 1.19 | 1.05/1.03 | 4.4 | 2.10 |
| 3D | | 1.26 | 9300 | 15 | 1.20 | 1.0/0.97 | 4.8 | 2.22 |

E: measured using ellipsometry
P: measured using profilometry

Table I should be considered as four independent sets of data: 1A-4A, 1B-2B, 1C-3C and 1D-3D. Prior to the water vapor treatment, each set of films was treated identically and exhibited similar porosity (n=1.14-1.15). Following the water vapor treatment, porosity in terms of (refractive index) was measured. The films were then chemically treated (dehydroxylation/hydrophobation) and their moduli and dielectric constants were measured. For each set of samples, a significant increase (0.5 GPa or more) in modulus is obtained with increasing exposure to water vapor. The thickness and porosity of the films decrease with increasing modulus, and a corresponding increase in dielectric constant is observed. To shorten exposure times, higher water vapor concentrations, e.g. over 20,000 ppm, were employed. This produced cracked films. The data demonstrates that post-calcination treatments of approximately 2000 to approximately 10,000-15,000 ppm water vapor for three to forty hours at ambient temperature produces porous ceramic films having moduli of elasticity greater than 4.0 and dielectric constant k equal to or less than 2.2.

The effect of water vapor on the mechanical integrity of the porous ceramic after calcinations can be enhanced if the film is exposed to water vapor at elevated temperatures. Heating the porous ceramic films during the humidity treatment to a minimum of approximately 50° C. to approximately 450° C. allows the film to be exposed to water vapor concentrations up to and exceeding 35000 ppm, without detrimental effects on the film. The upper temperature limit was maintained at 450° C. because of the targeted microelectronic applications of these films. However, in principle, much higher temperatures can be employed. For example, porous ceramic films could be used for some gas adsorption or catalysis or as membranes. These typically might be used at temperatures as high as approximately 1000-1200° C., and thus process temperatures might be much higher than described herein for microelectronic applications. The high temperatures and water vapor concentrations greatly reduce the exposure time required to produce high elastic modulus films. Table II below demonstrates the increase in modulus with increasing water vapor concentrations at treatment temperatures of 425° C. Again, the data should be viewed as independent sets of samples: 1E-3E, 1F-3F, and 1G-3G. Each set of samples was treated identically through calcination.

TABLE II

| Film | Thickness Before $H_2O$ exposure (Microns) (E) | $H_2O$ ppm | Time of $H_2O$ exposure (min) | Temp. of $H_2O$ exposure (° C.) | Thickness After $H_2O$ exposure (Microns) E/P | Elastic Modulus (GPa) | Dielectric Constant-k at 200° C. |
|---|---|---|---|---|---|---|---|
| 1E | 1.20 | 0 | 0 | NA | 1.2/1.16 | 3.0 | 1.99 |
| 2E | 1.17 | 4000 | 45 | 425 | 1.15/1.13 | 3.7 | 2.00 |
| 3E | 1.18 | 15000 | 45 | 425 | 1.09/1.08 | 4.0 | 2.04 |
| 1F | 1.14 | 0 | 0 | NA | 1.14/1.11 | 3.5 | 2.15 |
| 2F | 1.15 | 4000 | 45 | 425 | 1.09/1.07 | 4.2 | 2.07 |
| 3F | 1.15 | 15000 | 45 | 425 | 1.0/1.00 | 5.3 | 2.21 |
| 1G | NAV | 0 | 45 | 425 | 0.9/0.90 | 3.5 | 2.03 |
| 2G | NAV | 15000 | 45 | 425 | 0.87/0.90 | 3.7 | 2.05 |
| 3G | NAV | 21000 | 45 | 425 | 0.84/0.85 | 4.5 | 2.04 |

E: measured using ellipsometry
P: measured using profilometry
NA: Not Applicable
NAV: Not Available The data illustrate a decrease in film thickness and an increase in modulus, for films subjected to the humidity treatment. However, the dielectric constant did not change significantly.

Table III below illustrates the data for one set of films that were treated with the same concentration of water vapor at varying exposure times. These data indicate that an exposure time of only fifteen minutes can result in increased elastic modulus. Other samples show significant increase in modulus (>4.0 GPa) with exposure times as low as ten minutes. Even shorter times, no more than a few minutes, are believed to be adequate for obtaining significant improvements to the elastic modulus.

TABLE III

| Film | Thickness Before $H_2O$ exposure (Microns) | $H_2O$ ppm | Time of $H_2O$ exposure (min) | Temp. of $H_2O$ exposure (Microns) | Thickness After $H_2O$ exposure (Microns) | Elastic Modulus (GPa) | Dielectric Constant k at 200° C. |
|---|---|---|---|---|---|---|---|
| 1H | 1.03 | 0 | 0 | NA | NAV | 2.2 | 1.93 |
| 2H | 1.00 | 15000 | 15 | 425 | 0.99 | 2.7 | 1.96 |
| 3H | 1.01 | 15000 | 45 | 415 | 1.01 | 2.8 | 1.90 |

NA Not Applicable
NAV Not Available

The treatment of porous ceramic films with water vapor at concentrations up to 35000 ppm, at temperatures ranging from ambient to 450° C., and for exposure times ranging from a few minutes to several days, can greatly enhance the mechanical integrity of the film without significantly changing the dielectric constant of the material. The beneficial result of such humidity treatments include a much stronger film (i.e. elastic modulus increases of more than approximately 0.5 Gpa and overall elastic moduli over 3.5 GPa) while still maintaining a high degree of porosity (i.e. dielectric constants at or near 2.0).

It is believed that synthesis of porous silica or hybrid silicate films from calcinations of spin-coated aqueous solution precursors can result in inadequate cross-linking within the wall structure. It is also believed that this inadequate cross-linking can result in porosity on the angstrom (sub-nanometer) scale and possibly some remnant —OH terminations within the wall. This decreased wall density can result in a lower modulus. It is believed that the novel humidity treatment disclosed herein facilitates more complete cross-linking within the ceramic network and a stress relief of the porous film.

Thus, the invention involves a humidity treatment (i.e. treatment in humid environments containing liquid phase components, e.g. water) to improve the elastic modulus of porous ceramic (e.g. porous silica) and hybrid ceramic or organoceramic (e.g. organosilicate) films. This is accomplished without substantial detrimental changes to the porosity and dielectric constant. The invented method is believed to be applicable to any porous silicate or organosilicate film regardless of the type of pore former used in creating porosity. The invention has been found to be particularly effective with surfactant-templated silicate films with unique nanometer-scale porosity. While the films in the disclosed experiments and samples contained disordered porosity, the procedure should be substantially equally effective on films having ordered porosities.

Further variations in temperatures, exposure times and water vapor concentrations during the drying and calcinations processes of the green film may be determined to have beneficial effects on the mechanical and dielectric properties of ceramic films. Water vapor either in pure form or in combination with other gases, e.g. nitrogen, oxygen and argon, etc., may be used to obtain the desired beneficial effects.

Second Embodiment

In accordance with a second embodiment of the invention, certain chemical additives have been discovered to be productive of high-purity, low-dielectric constant ceramic and ceramic hybrid films, the process being described below.

A representative approach to making low k films uses surfactants as the pore former. In a typical approach to the surfactant-templated formation of porous ceramic films, a silica precursor solution used for evaporative-coating of a thin mesoporous silica film on to a silicon wafer is typically composed of TEOS (tetraethyl orthosilicate), surfactant and water dissolved in a polar organic solvent such as an alcohol, glycerol, or other suitable polar solvent. (See U.S. Pat. No. 5,922, 299). The solution is aged for a set time and at a set temperature to allow for the formation of a specific range of sizes of oligomeric hydroxylated silica units. The hydrolysis reaction is catalyzed by the addition of a small amount of acid or base, and to generate the ultimate porosity, a surfactant (non-ionic or ionic) is used as a pore former in the deposition solution mixture. After evaporative-coating onto a silicon wafer, the wafer essentially has a "green" film (oligomeric highly hydroxylated silica units mostly in solid phase but still partially dissolved in the remaining solvent and water) deposited on it.

The green film is dried to remove the remaining solvent and facilitate some consolidation of the structure, and calcined (heated) to complete or carry out further cross-linking between oligomeric silica units. The drying step is carried out at lower temperatures (100-200° C.) while the calcinations is carried out at more elevated temperatures (250-450° C.). In addition to cross-linking the oligomeric silica units, the calcinations process also serves to remove surfactant from the silica framework (strut or wall structure) to create the nanometer scale porosity.

This calcinations step is carried out in air or in inert gas environments (e.g. nitrogen, argon etc.), or in inert gas environments containing a specified amount of oxygen or air. Calcination is more efficient at removing surfactant if carried out in air. Calcination in air also has a significant effect on the extent of cross-linking within the silica network. Air-calcined films are more completely cross-linked than are nitrogen calcined films. Specifically, for films with nearly identical refractive indices, n, (e.g. 1.16 in a porous silica film), air-calcined films have higher mechanical integrity (elastic modulus is higher by at least 0.5 GPa) than nitrogen-calcined films. Following calcinations, the mesoporous silica film can be chemically treated further to dehydroxylate and hydrophobize the film and producing a film with a low dielectric constant k. There can be variations to this approach of making nanoporous silicate films, including but not limited to variations in the solvent system, silica precursor, or type of pore former. In addition, the chemical dehydroxylation step may or may not be used. Nevertheless, the procedure described above can be considered as a good example, and has been used to illustrate the described invention. The invention described below has been found to be particularly effective with surfactant-templated silicate films with nanometer-scale porosity, but should be applicable as well to porous ceramic and hybrid ceramic films and other structures such as powders and fibers.

The presence of trace amounts (100 ppb (parts per billion)-1000 ppm (parts per million)) of alkali metals (e.g. sodium and/or potassium) has a beneficial effect on the properties of cross-linked silicate films. The metal impurities result in a more stable, uniform (with respect to thickness) film, with a specific porosity (represented by a specific refractive index) when the calcinations is carried out in air. Without the trace alkali metal contamination, under the same or similar preparation conditions (i.e. air calcinations) the resulting film is less uniform (with respect to thickness), has a more uneven surface and has significantly less porosity (higher refractive index).

The effect of added alkali metal (e.g. potassium content) to deposition solution on the refractive index (inversely related to porosity) of the final calcined porous silica films is illustrated in Table IV below. The deposition solution contained tetraethyl orthosilicate (TEOS), water, ethanol, nitric acid, and 10 lauryl ether as the surfactant, in the following molar ratio: 1:5:5:0.05:0.17. The solution was spin coated at a rate of 2000 rpm.

TABLE IV

| Potassium additions to deposition solution (ppb, or parts per billion) | Heat Treatment #1 (air) 375° C. (6 min) Refractive Index | Heat Treatment #2 (air) 150° C. (2 min) + 425° C. (2 min) Refractive Index |
| --- | --- | --- |
| (0)(*) | 1.28 | 1.24 |
| 33 | NA | 1.223 |
| 50 | 1.3 | 1.225 |
| 100 | NA | 1.192 |

TABLE IV-continued

| Potassium additions to deposition solution (ppb, or parts per billion) | Heat Treatment #1 (air) 375° C. (6 min) Refractive Index | Heat Treatment #2 (air) 150° C. (2 min) + 425° C. (2 min) Refractive Index |
|---|---|---|
| 150 | 1.206 | 1.185 |
| 300 | 1.17 | 1.173 |
| 50,000 (†) | 1.156 | 1.168 |

(*)The solution without added metals could inherently contain between 0 and 40 parts per billion metal picked up as contamination during preparation in standard lab conditions or from raw chemicals that have not been specifically purified for semiconductor chip fabrication applications
(†)equivalent to 50 ppm, or parts per million
NA = Not Applicable Using specific treatments involving air calcinations as shown above, the presence of trace alkali metal ions in the approximate range 200 ppb-50 ppm, results in smooth uniform films with refractive indices less than 1.17, along with elastic modulus values near 4.0 GPa and dielectric constants close to 2.0. The identically prepared film, but without the alkali metal contamination, is less porous, with a refractive index over 1.20, a higher modulus (0.5 GPa higher), an uneven (texturally) spotty surface, a non-uniform thickness, and an undesirably high dielectric constant (k>2.5).

The film uniformity and surface smoothness can be improved if calcination is carried out in a nitrogen atmosphere. However, this results in a film that is significantly weaker (elastic modulus is lower by about 0.5 GPa or more) and contains higher concentrations of residue from the surfactant. For many key film applications in semiconductor devices, removal of the alkali metal contamination is necessary because of potential electrical problems with alkali metal impurities. Without alkali metal present, a smooth, consistently uniform high performance film cannot be easily and reliably achieved if calcinations is carried out in air or in inert gas environments containing some concentrations of oxygen.

Although trace alkali metals above 50 ppb are generally unacceptable in semiconductor manufacturing applications, an understanding of their role in producing film properties will allow identification of a suitable substitute that mimics their effects. First, the mechanism of silica structure control through the presence of alkali metals in trace amounts in a deposition solution containing silica cross-linkable precursors will be discussed.

It is believed that the alkali ions play a highly "mobile, ionic role" in which they interact with surface hydroxyl groups allowing them to exist as more nucleophilic Si O⁻ anions. These short-lived anions could undergo a series of addition/elimination reactions traveling through the silica framework driven by strain in the matrix.

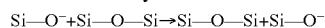
Si—O⁻+Si—O—Si→Si—O—Si+Si—O⁻

The highly mobile alkali cations simply follow this migrating charge as it works its way through silica walls around the surfactant aggregates. This theoretical mechanism could be described as a low temperature stress-relief annealing process that allows for the heating of defects within the silica matrix. In the absence of the stabilizing alkali cation, this process would be much slower as it would involve the much less nucleophilic Si—OH group, ultimately resulting in a more strained, defective film. This low-temperature annealing process is a continuous one occurring throughout the solution aging. In accordance with one embodiment of the invention, the aging time at room temperature was 20-24 hours. Nevertheless, depending on the solution, it is believed that the mixed solution may very simply be maintained between 0° C. and 100° C. for any suitable period of time between a few seconds and many days. The same low-temperature annealing process is continued through the spinning and drying states, and on through the calcination stage. However, the alkali ions remain in the film after calcination is complete, and their presence is detrimental to the electrical performance of semiconductor devices containing such films, and therefore organic additives that can substitute for the alkali metals, but which leave no inorganic residue, are very desirable.

Through experiments supportive of the claimed invention, it has been determined that novel organic additives can mimic the role of alkali metals in controlling the molecular structure of silica in depositing films. The addition of trace amounts of alkylated ammonium salts to deposition solutions for films prepared as described in Table IV, except that the deposition solution contains almost no alkali metal (the solution contains only 0-40 ppb metal), results in films with significantly lower refractive index. This beneficial effect of alkylated ammonium nitrate additions is shown in Table V below. Using deposition solutions containing parts per million levels of tetra methyl ammonium chloride, (see Table V re tetremethyl ammonium nitrate) smooth uniform films with refractive index, n, less than 1.17 after calcinations, and with elastic modulus near 4.0 GPa and dielectric constants k close to 2.0 after silylation (treatment with a silane to minimize hydroxyl surface groups and obtain stable, measurable dielectric constants) have been obtained.

During calcinations, these salts are removed from the film via sublimation and thermal decomposition. Thus the desired film is produced without inorganic metal contamination, and the trace alkylated ammonium salt is removed. It is postulated that the role of the alkylated ammonium ions in the aging, spinning, drying, and calcination stages is similar to the role of the alkali metal cations. Multiple film samples have been synthesized employing tetramethyl ammonium salt additives in highly pure deposition solutions. Using air-calcinations procedures, smooth uniform films with high elastic moduli and low dielectric constants have been obtained. In fact, it is noted from Table V below that air calcination treatment in at least one case produced a lower refractive index than did alternative calcination treatments.

TABLE V

| Tetramethyl ammonium nitrate additions to deposition solution ppm | Heat treatment (in air unless otherwise specified) | Refractive index | Thickness un | k @ 200° C. | Modulus GPA |
|---|---|---|---|---|---|
| 0 | 375° C. for 6 min | 1.24 | 0.91 | >2.4 | >5 |
| 0.74 | 375° C. for 6 min | 1.18 | 1.07 | 2.27 | 3.8 |
| 1.48 | 375° C. for 6 min | 1.175 | 1.11 | 2.2 | 3.3 |
| 2.96 | 375° C. for 6 min | 1.168 | 1.12 | 2.17 | 2.8 |

TABLE V-continued

| Tetramethyl ammonium nitrate additions to deposition solution ppm | Heat treatment (in air unless otherwise specified) | Refractive index | Thickness un | k @ 200° C. | Modulus GPA |
|---|---|---|---|---|---|
| 5.91 | 375° C. for 6 min | 1.16 | 1.16 | 2.09 | NA |
| 11.8 | 375° C. for 10 min | 1.15 | 1.16 | 1.99 | 3 |
| 11.8 | 375° C. for 10 min + 425° C. 2.1% $H_2O$, $N_2$ for 20 min | 1.162 | 1.11 | 1.99 | 3.3 |
| 11.8 | 375° C. for 10 min + 425° C. in 1.5% $H_2O$, $N_2$ for 45 min | 1.15 | 1.08 | 2.04 | 4.0 |

\* The solution without added salts could inherently contain –.0–40 ppb metal picked up as contamination during preparation in standard lab conditions or from raw chemicals that have not been specially purified.
\*\* nominally identical to film with refractive index of 1.24 in Table IV, except small changes in refractive index n of < or = 0.01 are typically observed from batch to batch
† equivalent to 30 ppm (parts per million)
NA = Not Available A second set of experiments was conducted in which the mobile cationic species used was cetyl (cetyl=C16H33) trimethyl ammonium ion. It was postulated that perhaps the cetyl trimethyl ammonium ion, which is much larger than a tetramethyl ammonium ion, could perform as a surfactant as well as a stabilizing mobile cationic species. Deposition solutions containing the non-ionic 10 lauryl ether surfactant, as described in Table IV were prepared without alkali metals, and with varying levels (300-30,000 ppm) of CTAC (cetyl trimethyl ammonium chloride). The films were calcined in air as described above. Film quality was greatly improved over the films prepared without the CTAC additive. The films were more uniform and significantly more porous than those without the additive. However, film quality was still lower than desired. Surface smoothness was poor (highly striated) and porosity was lower than desired.

This may be due to the different mobility of the much larger cetyl substituted ammonium ion relative to the methyl (CH3)-substituted ion. However, it is important to note the improvement in film quality when the cetyl ammonium ion is used versus solutions not containing a stabilizing cationic species. This observation suggests that slightly smaller cationic surfactants such as dodecyl-(C12H25) or octyl-(C8H17) substituted trimethyl ammonium ions could function not only as a pore former, but also as a catalyst, for refining the silica structure in the pore walls and providing high mechanical integrity.

The presence of tetraalkyl ammonium cations in the as-spun film provides a mechanism for enhancing the cross-linking of the silicic acid structural units, facilitating the film thickness uniformity and allowing the films to be calcined in air without concern for film morphology distortion. The result of including the tetraalkyl ammonium cation is a much stronger film (i.e. higher elastic modulus), with a high degree of porosity (i.e. lower k values) and no contamination resulting from added alkali metal cations or other inorganic species. These goals are accomplished through a low-temperature stress relief of the mesoporous ceramic film that is facilitated by the tetraalkyl ammonium cation.

Other types of nitrogen-based cations, (i.e. other than tetraalkyl ammonium), such as pyridinium, guanidinium and imidazolium should also be equally effective at facilitating this type of chemistry. The chemistry might also be accomplished by using sulfur containing (e.g. thiuronium), phosphorous-containing (e.g. phosphonium) or arsenic-containing (e.g. arsonium) cationic species. However, these materials are anticipated to leave new inorganic residues in porous ceramic and porous hybrid films after calcinations, and may only be used if such residues are not performance-limiting.

Accordingly, having illustrated and described the principles of our invention in two different embodiments thereof, it should be readily apparent to those skilled in the art that the invention can be modified in arrangement and detail without departing from such principles. We claim all modifications coming within the spirit and scope of the accompanying claims.

The invention claimed is:

1. A method of forming a porous ceramic or organoceramic thin film material, the method comprising:
    combining a ceramic precursor solution and a pore former into a mixture;
    forming a thin film material from the mixture by evaporation;
    substantially removing the pore former by heating the thin film material to cause calcination and to form a thin film, porous material with the pore former removed; and
    treating the thin film, porous material by exposure to a humid environment after calcination and removal of the pore former thereby causing an elevation in an elastic modulus of the material.

2. The method of claim 1, wherein said exposure is to a water vapor.

3. The method of claim 2, wherein said exposure of the porous material to a humid environment includes exposure to water concentrations of between approximately 2000 parts per million and 35,000 parts per million and in defined temperatures of between approximately 20° C. and approximately 450° C.

4. The method of claim 1 where the porous material is further treated by exposure to chemical dehydroxylation agents.

5. The method of claim 1, wherein the ceramic precursor solution includes a ceramic precursor and a solvent system, wherein the pore former is a surfactant, and wherein the porous material is a film on a substrate.

6. The method of claim 1, wherein the porous material is a fiber or a powder.

7. A method of forming a porous ceramic or organoceramic thin-film silicate material, the method comprising:
    combining a ceramic precursor solution, an additive comprising nitrogen-based cations and a pore former into a mixture;

forming a material from the mixture by evaporation; and substantially removing the pore former by heating the material to cause calcination wherein the calcination occurs in air.

8. The method of claim 7, wherein the mixture contains less than about 50 parts per billion of alkali and alkaline earth impurities.

9. The method of claim 7, wherein the nitrogen-based cations include tetraalkyl ammonium cations.

10. The method of claim 7, wherein the nitrogen-based cations are selected from a group consisting of pyridinium, guanidium and imidazolium.

11. The method of claim 7 in which the method further comprises:

treating the film by exposure to a chemical dehydroxylation agent.

12. The method of claim 7, wherein the ceramic precursor solution includes a ceramic precursor and a solvent system, wherein the pore former is a surfactant, and wherein the porous material is a film on a substrate.

13. The method of claim 7, wherein the porous material is a fiber or a powder.

14. A method of forming a mesoporous silicate material, the method comprising:

forming a mixture comprising a silicate precursor, a solvent, an additive comprising nitrogen-based cations, wherein the mixture contains at least 50 parts per billion of one or more nitrogen-based cations;

combining the mixture with a surfactant;

forming the precursor solution into a preform;

heating the preform in air to remove substantially all of the surfactant and to cause calcination to obtain a heated mesoporous material; and dehydroxylating the heated mesoporous material.

15. The method of claim 14, wherein nitrogen-based cations include tetraalkyl ammonium cations.

16. The method of claim 14, wherein the nitrogen-based cations are selected from the group consisting of tetraalkyl ammonium, pyridinium, guanidium and imidazolium.

* * * * *